United States Patent [19]

Dyson et al.

[11] Patent Number: 4,622,082

[45] Date of Patent: Nov. 11, 1986

[54] CONDITIONED SEMICONDUCTOR SUBSTRATES

[75] Inventors: William Dyson, St. Peters; Jon A. Rossi, Ballwin, both of Mo.

[73] Assignee: Monsanto Company, St. Louis, Mo.

[21] Appl. No.: 607,996

[22] Filed: Jun. 25, 1984

[51] Int. Cl.$^4$ .................. H01L 21/324; H01L 21/322
[52] U.S. Cl. ...................................... 148/33; 148/1.5; 148/DIG. 60; 29/576 T; 156/DIG. 66
[58] Field of Search ................ 29/571, 576 T; 148/33, 148/33.3, 33.4, 174, 175, 1.5, DIG. 60; 156/DIG. 66

[56] References Cited

U.S. PATENT DOCUMENTS

| 4,053,335 | 10/1977 | Hu .............................. | 148/DIG. 60 |
| 4,376,657 | 3/1983 | Nagasawa et al. ............ | 148/187 X |

FOREIGN PATENT DOCUMENTS

| 0030457 | 6/1981 | European Pat. Off. ..... | 148/DIG. 60 |
| 0066461 | 12/1982 | European Pat. Off. ..... | 148/DIG. 60 |
| 0211737 | 12/1982 | Japan .......................... | 148/DIG. 60 |
| 2080780 | 2/1982 | United Kingdom ....... | 148/DIG. 60 |

OTHER PUBLICATIONS

Nagasawa et al, "A New Intrinsic Gettering Technique . . . ", Appl. Phys. Lett., 37(7), Oct. 1980, pp. 622–624.
Kugimiya et al, "Denoded Zone & Microdefet Formation . . . " Semiconductor Silicon 1981, Electrochemical Society Inc., pp. 294 ∝ 303.
Craven et al, "Internal Gettering in Silicon" Solid State Technology, Jul. 1981, pp. 55–61.
Colclaser, "Microelectronics: Processing & Device Design", John Wiley & Sons, NY, 1980, pp. 62–66.
Shiraki, "Silicon Device Consideration . . . ", Semiconductor for Silicon, 1977, Electrochem. Soc. pp. 546–558.
Gaworzewski et al, "On the Out-Diffusion of Oxygen from Silicon", Phys. Stat., Sol.(a) 67, 511–516 (1981).
Huber et al, "Precipitation Process Design for Denoded Zone Formation in CZ-Silicon Wafers", Solid State Tech. Aug. 1983, pp. 137–143.
Tice et al, "Precipitation of Oxygen & Intrinsic Gettering in Silicon" Defects in Semiconductors, North Holland Inc., 1981, pp. 367–380.
Craven "Oxygen Precipitation in Czochralski Silicon", Semiconductor Silicon 1981, Electrochem Soc. Inc., pp. 254–271.
Series et al, "Influence of Precipitate Size & Capillary by Effects . . . " Semiconductor Silicon 1981, Electrochem Soc. Inc. , pp. 304–312.

*Primary Examiner*—Brian E. Hearn
*Assistant Examiner*—David H. Hey
*Attorney, Agent, or Firm*—Paul L. Passley

[57] ABSTRACT

N+ type semiconductor substrates containing oxygen are thermally treated to enhance internal gettering capabilities by heating at 1050° to 1200° C., then at 500° to 900° C. and finally at 950° to 1250° C.

10 Claims, No Drawings

CONDITIONED SEMICONDUCTOR SUBSTRATES

BACKGROUND OF THE INVENTION

1. Field of the Invention

This invention relates to semiconductor substrates useful in the manufacture of electronic devices such as integrated circuits. Particularly, this invention relates to bulk n+ type silicon substrates having enhanced oxygen precipitation characteristics suitable for fabricating electronic devices and/or for growing of n type epitaxial silicon films thereon and the resulting composite n/n+ substrates.

2. Description of the Prior Art

For many years, the electronics industry has extensively used epitaxial layers of silicon on bulk silicon substrates in the manufacture of devices. Most commonly, the layers are deposited onto bulk silicon material by well known chemical vapor technology to provide an epitaxial silicon layer having the same crystal structure as the bulk material. Use of epitaxial layers in device fabrication provides a valuable technique to achieve differing electrical characteristics between the bulk material and epitaxial layer through incorporation of dopants to obtain differing resistivities necessary for device or circuit operations.

Considerable art has been developed over the years on techniques and methods of epitaxially depositing silicon films on bulk silicon material. Most of this art has been directed to preventing incorporation of impurities (dopants) from the bulk material into the epitaxial layer so as to maintain the desired differing electrical properties between the bulk and epitaxial silicons. Redistribution of impurities from the bulk material to the epitaxial layer is commonly referred to as autodoping. Autodoping can be reduced or prevented by capping the bulk material with a layer of silicon dioxide. Silicon dioxide layers have customarily been formed on the bulk material at temperatures between 900° and 1100° C.

Another requirement by device fabricators of epitaxial silicon layers on bulk silicon material is a high degree of structural perfection in the epitaxial layer. Any defects, imperfections, impurities and contaminants at or near the surface of the bulk material will result in the formation of defects and imperfections which adversely affects the devices formed thereon or in epitaxial layers applied on the bulk material.

The advancing device technology, particularly VLSI device fabrication, has required greater perfection in silicon substrates in order to reduce the adverse affects of defects, contaminants and impurities on the devices produced. It has been known for some time that defects, contaminants and impurities can be caused to diffuse through the substrate material away from the active device region. This technique is referred to as gettering and is obtained by providing sites such as defects and impurities in the substrate material away from the active device region to attract and trap the defects, impurities and contaminants. A generally practiced method of introducing gettering sites to silicon substrates is by introducing mechanical damage to the backside of the silicon substrate.

Recently, as reported in "Solid State Technology", July 1981, page 55-61, the gettering ability of precipitated oxygen contained in the silicon substrates has been recognized. However, the art recognizes it is extremely difficult to achieve precipitation of oxygen in n+ type substrates. Articles by H. Tsuya et al in Jap. J. Appl. Phys. 22, p. 116 (1983) and by C. W. Pearce et al "VLSI Science and Technology 1982," C. J. Dell Oca and Wm. Bullis eds. (The Electrolchemical Society) page 53 both indicate up to 72 hours of annealing time is required to precipitate oxygen in n+ type silicon.

In copending application Ser. No. 466,249 filed Feb. 14, 1983, an improved silicon substrate having enhanced gettering ability for defects, contaminants and impurities is described and claimed. The improved substrate utilizes a layer of polysilicon on the backside of bulk silicon substrate to provide external gettering means. Suitable layer thicknesses are 0.05 to 2.0 microns. The polysilicon layer enhances the oxygen precipitation in the substrate which provides internal gettering ability. The combination of external polysilicon and internal oxygen gettering offers many advantages in the newer lower temperature device fabrication processes. The full teachings of this copending application for improved silicon substrates are hereby incorporated herein.

SUMMARY OF THE INVENTION

We have found that a high degree of internal gettering can be achieved with n+ type substrates through an enhancement in oxygen precipitation as well as structural perfection in n type epitaxial silicon layers on the surface of bulk n+ type silicon material even when oxygen nucleation sites are present at or near such surface of the bulk material.

Accordingly, typical objects of this invention are to provide:

(1) n+ type silicon substrate, having improved oxygen precipitation capability, (2) n+ type silicon substrate, free of oxygen precipitates at or near the active surface, suitable for epitaxial silicon growth, (3) a composite (n+/n) bulk-epitaxial layer silicon substrate having improved gettering capability subsequent during device fabrication, and (4) a process for thermally treating a n+ type silicon substrate containing oxygen to enhance oxygen precipitation during subsequent devise fabrication without precipitation of the oxygen at or near the active surface to prevent defect formation during device fabrication or epitaxial silicon growth.

Other objects, aspects and advantages of this invention will become apparent to those skilled in the art from this disclosure and the appended claims.

In accordance with this invention, a n+ type silicon substrate is heated at a temperature of 1050° to 1200° C. for 15 minutes to 6 hours to denude the surface region of oxygen, the temperature is reduced to 500° to 900° C. and the substrate heated, generally at least 30 minutes, for a period sufficient to nucleate the oxygen. The first heating step can be conducted in the presence of hydrogen and oxygen to form a silicon dioxide layer on the substrate. The second heating step is generally carried out in the presence of nitrogen. Any silicon dioxide layer formed on the active surface of the silicon substrate is stripped therefrom using known techniques such as acid etching while protecting the silicon dioxide coating on the other surfaces, and the substrate is then polished and cleaned.

The improved silicon substrate of this invention is characterized by being free of precipitates such as of oxygen. The coating of silicon dioxide on the nonactive surfaces prevents diffusion of impurities from the bulk material to the gaseous reactants used to epitaxially deposit layers of silicon on the active surface.

Further, in accordance with this invention, a layer of n type silicon is epitaxially grown thereon. Any method known in the art to epitaxially grow silicon layers on substrates can be used. A typical growth method comprises contacting the substrate at a temperature of about 950° to 1250° C., preferably at about 1050° to 1100° C. in an atmosphere of hydrogen containing 0.01 to 1.5 volume percent silane.

If the substrate is not to be utilized for epitaxially growing a n type silicon layer thereon, the substrate after the heating at the 500° to 900° C. range is further heated at a temperature of 900° to 1150° C. for up to 12 hours, generally in the presence of nitrogen, to condition and stabilize the oxygen nuclei for precipitation during subsequent device processing conditions. The precipitated oxygen provides dislocations and stacking faults which in turn provides sites for gettering.

Any single crystal silicon material suitable for use in electronic device fabrication can be used to prepare the substrates of this invention. Also, the silicon material may be doped with any suitable impurities and quantities thereof as required to provide the desired electrical characteristics in the substrate.

The use of a layer of polysilicon on the backside of the silicon substrate in accordance with this invention is fully described in copending application Ser. No. 466,249, filed Feb. 14, 1983, the teaching of which is incorporated herein by reference.

DESCRIPTION OF PREFERRED EMBODIMENTS

In the following examples, silicon wafers prepared from n $<100>$ antimony doped silicon crystals having a 0.02 ohm-cm resistivity and controlled oxygen contents of 26–35 ppma or 30–40 ppma are used. The wafers are divided into three groups. Group A has a standard chemically etched backside, Group B has a standard mechanically damaged backside and Group C has a layer of polysilicon applied on the backside in accordance with the teachings of copending patent application Ser. No. 466,249 filed Feb. 14, 1983. In order to insure uniform comparisons of the oxygen precipitation in the wafers regardless of variations in oxygen concentrations and thermal history of the crystal, each wafer is quartered and each quarter is given a different treating time only in one step of the thermal cycles tested.

EXAMPLE 1

Candidate wafer quarters from each of the three Groups A, B and C and oxygen content of 26–35 ppma are subjected to the various thermal cycles given in Table 1. After the thermal cycles, a strip is cleaved from each wafer quarter and given a 2 minute Wright etch. Averages of bulk defect densities determined using a Normarski differential interference contrast microscope at 200x at three points (1 cm from edge, R/2 and 1 cm from center) are given in Table 1.

TABLE 1

| Low-High | X | Bulk Defect Density/cm$^2$ | | |
|---|---|---|---|---|
| Thermal Cycle | (hours) | A | B | C |
| 1. X hours @ 750° C. | 8 | <1 | <1 | <1 |
| 2 hours @ 1100° C. | 12 | <1 | <1 | <1 |
| | 16 | <1 | <1 | <1 |
| | 32 | — | <1 | 2.8 × 10$^2$ |
| 2. X hours @ 750° C. | 8 | <1 | <1 | <1 |
| 6 hours @ 1100° C. | 12 | <1 | <1 | <1 |

TABLE 1-continued

| Low-High | X | Bulk Defect Density/cm$^2$ | | |
|---|---|---|---|---|
| Thermal Cycle | (hours) | A | B | C |
| | 16 | <1 | <1 | <1 |
| | 32 | <1 | 6.8 × 10$^2$ | 1.4 × 10$^3$ |
| 3. X hours @ 750° C. | 8 | <1 | <1 | <1 |
| 12 hours @ 1100° C. | 12 | <1 | <1 | 7.7 × 10$^2$ |
| | 16 | <1 | 1.5 × 10$^2$ | 1.2 × 10$^4$ |
| | 32 | 1.5 × 10$^3$ | 3.6 × 10$^3$ | 7 × 10$^3$ |
| 4. X hours @ 750° C. | 8 | <1 | <1 | <1 |
| 24 hours @ 1100° C. | 12 | <1 | <1 | 2.5 × 10$^3$ |
| | 16 | 8.5 × 10$^2$ | 70 | 8 × 10$^3$ |
| | 32 | 4.2 × 10$^3$ | 6 × 10$^3$ | 7.8 × 10$^3$ |

From the above data it is readily apparent that heat treating cycles capable of producing bulk defects commencing at a low temperature are very time consuming. For standard etched wafers (A) at least 40 hours (Run 4) thermal treatment is required before any bulk defects occur and for standard mechanical backside damaged wafers (B) at least 38 hours (Run 2) thermal treatment is required before bulk defects occur. With polysilicon backside wafers, the thermal treatment requires a minimum of 34 hours (Run 1) to obtain bulk defects. This data, however, shows a considerable enhancement in the bulk defects obtained for polysilicon backside wafers compared to standard etched and mechanically backside damaged wafers at the longer thermal treatment times.

EXAMPLE 2

Example 1 is repeated using the various thermal cycles given in Table 2 in accordance with this invention. The resulting bulk densities obtained are also shown in Table 2.

| High-Low-High | X | Bulk Defect Density/cm$^2$ | | |
|---|---|---|---|---|
| Thermal Cycle | (hours) | A | B | C |
| 1. 2 hours @ 1100° C. | 8 | <1 | <1 | 1.3 × 10$^3$ |
| X hours @ 750° C. | 12 | <1 | <1 | 1.5 × 10$^3$ |
| 2 hours @ 1100° C. | 16 | <1 | <1 | 1.1 × 10$^3$ |
| | 32 | <1 | <1 | 2 × 10$^3$ |
| 2. 2 hours @ 1100° C. | 8 | 7.5 × 10$^2$ | 3.1 × 10$^3$ | 1.3 × 10$^4$ |
| X hours @ 750° C. | 12 | 3 × 10$^3$ | 2 × 10$^3$ | 2.2 × 10$^4$ |
| 24 hours @ 1100° C. | 16 | 1.8 × 10$^3$ | 1.3 × 10$^3$ | 1.2 × 10$^4$ |
| | 32 | 6 × 10$^3$ | 5.2 × 10$^3$ | 5.1 × 10$^3$ |
| 3. 2 hours @ 1100° C. | 2 | <1 | <1 | 1.4 × 10$^3$ |
| 8 hours @ 750° C. | 12 | 8.4 × 10$^2$ | 1.6 × 10$^3$ | 1 × 10$^4$ |
| X hours @ 1100° C. | 24 | 7.8 × 10$^2$ | 3.5 × 10$^3$ | 1.4 × 10$^4$ |

From the above data it is readily apparent that thermal treating cycles in accordance with this invention reduce the time required to obtain oxygen precipitation in the wafers. For standard chemically etched wafers and mechanically damaged wafers at least 22 hours (Run 3) are required. However, for polysilicon backside wafers, defects occur at treating times of only 12 hours (Runs 1 and 3).

A comparison of the data from Example 1 and Example 2 clearly shows the advantages of using an initial high temperature treatment in the thermal cycle (Example 2) compared to the prior art teachings for an initial low temperature treatment in the treating cycle (Example 1). The thermal treatment of this invention cuts the prior art time required for thermal treatment by $\frac{1}{2}$ to $\frac{2}{3}$, a considerable savings in the fabrication of wafers. Another advantage of this invention is that a sufficient oxygen denuded zone is obtained at the active surface of the wafer for defect free fabrication of devices or formation of epitaxial layers. The prior art conditioning teachings do not form sufficient oxygen denuded zones to provide defect free surfaces for device or epitaxial layer formation. Further advantages of this invention are that oxygen precipitation is conditioned or controlled so that it occurs during subsequent device fabrication to provide gettering ability throughout subsequent processing. Also, the conditioning of substrates in accordance with this invention permits the wafer to be polished and cleaned after the 500° to 900° C. treating as no oxygen precipitation has occurred in the bulk material. This advantage is particularly attractive when the substrate is to be used for epitaxial growth.

This invention is applicable to any oxygen containing bulk silicon. The quantity of oxygen present in the silicon is not critical and may vary over a wide range. Generally, silicon employed in the electronics industry today will contain from 10 to 40 ppma oxygen. The thickness of the silicon dioxide layer formed in accordance with this invention may also vary over a wide range. Generally bulk substrates will be sealed with silicon dioxide thicknesses ranging from 0.03 to 2 microns.

Although the above specific examples have utilized specific characterized silicon substrate materials, it will be understood by the artisan that the low temperature CVD silicon oxide sealing of this invention will be applicable to any crystal structure silicon containing various impurities and quantities thereof and that changes and modifications from the specifics given herein may be made without departing from the scope of the invention and appended claims.

We claim:

1. A process for thermally conditioning oxygen containing n+ type semiconductor materials to enhance their internal gettering characteristics comprising heating said material at a temperature of 1050° to 1200° C. in an oxidizing atmosphere for a sufficient period of time to denude the surface region of oxygen and then at a temeprature of 500° to 900° C. in a reducing atmosphere for a sufficient period of time to nucleate the oxygen.

2. The process of claim 1 wherein said semiconductor material has a polysilicon layer on the backside.

3. The process of claim 2 wherein said polysilicon layer has a thickness of 0.05 to 2.0 microns.

4. The process of claim 1 wherein said semiconductor material is n+ type silicon.

5. The process of claim 4 wherein said silicon contains antimony.

6. The process of claim 5 wherein said silicon contains 10 to 40 ppma oxygen.

7. The process of claim 1 further comprising heating said material at a temperature of 900° to 1150° C. in an inert atmosphere for a sufficient period of time to precipitate the oxygen.

8. The process of claim 1 wherein said sufficient period of time to denude the surface region of oxygen is 15 minutes to 6 hours and said sufficient period of time to nucleate the oxygen is at least 30 minutes.

9. The process of claim 7 wherein said sufficient period of time to precipitate the oxygen is up to 12 hours.

10. The process of claim 7 wherein said inert atmosphere is nitrogen.

* * * * *